United States Patent [19]

Huang et al.

[11] Patent Number: 5,625,231

[45] Date of Patent: Apr. 29, 1997

[54] LOW COST SOLUTION TO HIGH ASPECT RATIO CONTACT/VIA ADHESION LAYER APPLICATION FOR DEEP SUB-HALF MICROMETER BACK-END-OF LINE TECHNOLOGY

[75] Inventors: Richard J. Huang, Milpitas; Robin W. Cheung, Cupertino, both of Calif.

[73] Assignee: Advanced Micro Devices, Inc., Sunnyvale, Calif.

[21] Appl. No.: 402,254

[22] Filed: Mar. 10, 1995

[51] Int. Cl.$^6$ .............................. H01L 23/48; H01L 29/41
[52] U.S. Cl. .......................... 257/751; 257/915; 257/753; 257/768; 257/774; 257/770
[58] Field of Search ....................... 257/764, 768, 257/763, 786, 769, 767, 770, 794, 296, 915, 752, 751, 753

[56] References Cited

U.S. PATENT DOCUMENTS

| | | | |
|---|---|---|---|
| 4,502,209 | 3/1985 | Eizenberg et al. | 257/751 |
| 4,820,611 | 4/1989 | Arnold, III et al. | 430/271 |
| 4,887,146 | 12/1989 | Hinode | 257/915 |
| 4,960,732 | 10/1990 | Dixit et al. | 257/753 |
| 4,961,822 | 10/1990 | Liao et al. | 257/753 |
| 4,994,410 | 2/1991 | Sun et al. | 257/915 |
| 5,008,730 | 4/1991 | Huang et al. | 257/753 |
| 5,175,608 | 12/1992 | Nihei et al. | 257/913 |
| 5,202,579 | 4/1993 | Fujii et al. | 257/915 |
| 5,204,286 | 4/1993 | Doan | 257/752 |
| 5,354,712 | 10/1994 | Ho et al. | 437/228 |

FOREIGN PATENT DOCUMENTS

| | | | |
|---|---|---|---|
| 0055861 | 3/1989 | Japan | 257/752 |
| 0292765 | 12/1991 | Japan | 257/752 |
| 0152566 | 5/1992 | Japan | 257/915 |
| 3167546 | 6/1992 | Japan | 257/751 |

*Primary Examiner*—Sara W. Crane
*Assistant Examiner*—Alexander Oscar Williams
*Attorney, Agent, or Firm*—Benman Collins & Sawyer

[57] ABSTRACT

A process for applying a TiN contact/via adhesion layer to high aspect ratio contact/via openings etched in a dielectric comprises providing a first layer of TiN on the bottom of the contact/via openings and then depositing the second layer of TiN on the first layer of TiN and on the sidewalls of the contact/via openings. The second layer of TiN serves as the contact/via adhesion layer for structurally supporting the adhesion of a tungsten plug in the contact/via openings. In the case where a contact is etched in the dielectric down to a junction with a titanium silicide layer on top, the first layer of TiN on the bottom of the contact opening is provided by a rapid thermal anneal in a nitrogen-containing atmosphere which converts the top part of the titanium silicide layer in the contact into a barrier TiN layer. Alternatively, in the case where a contact is etched in the dielectric down to an underlying barrier TiN layer, the first layer of TiN on the bottom of the contact opening can be provided by a contact etch which is able to stop on an underlying barrier TiN layer with minimum TiN loss. In the case where a via is etched in the dielectric down to an underlying TiN anti-reflection coating on top of a metal layer, the first layer of TiN on the bottom of the via is provided by a via etch which is able to stop on the underlying TiN anti-reflection coating on top of the metal layer with minimum TiN loss.

5 Claims, 3 Drawing Sheets

LOW COST SOLUTION TO HIGH ASPECT RATIO CONTACT/VIA ADHESION LAYER APPLICATION FOR DEEP SUB-HALF MICROMETER BACK-END-OF LINE TECHNOLOGY

CROSS-REFERENCE TO RELATED APPLICATION

This application is related to the application Ser. No. 08/402,252, filed on even date herewith. That application concerns the use of a rapid thermal anneal in a nitrogen-containing atmosphere to form a barrier TiN layer at the bottom of contact openings. The present application is directed to the process involving the application of an adhesion layer on high aspect ratio contact/via openings in a dielectric.

TECHNICAL FIELD

The present invention relates generally to semiconductor processing, and, more particularly, to improving the structural and electrical integrity of contacts and interconnects comprising metals deposited by physical vapor deposition (PVD) or chemical vapor deposition (CVD) during processing of sub-half micrometer semiconductor devices.

BACKGROUND ART

The present integrated circuit devices comprise a silicon substrate, doped regions in the semiconductor to which source or drain connections are made, separated by a gate control region. Metal connections to the source, gate, and drain electrodes are made by multilayer interconnects, which are supported over the substrate by an interlayer dielectric. To make electrical connection between different layers, the dielectric is sequentially patterned and etched to form contact and via openings. These opening are filled with plugs of an electrically conductive material such as tungsten, which contacts previously-doped regions, polysilicon, or other metal layers. A layer of PVD (physical vapor deposited) metal, i.e. TiN, is typically deposited on the sidewall of the contact/via openings to serve to structurally support the adhesion of the tungsten plug. The thickness of the TiN deposit typically ranges from 400 Å or more (i.e., 1100 Å) to maintain a thick enough TiN layer on the sidewalls to support the tungsten plug.

As device geometry gets smaller ($\leq 0.35$ μm) and contact/via aspect ratios (the ratio of height to diameter) become higher (close to 2.0 or higher), step coverage of the TiN becomes a concern. Due to concern about decreased step coverage, the TiN layer is required to be thick enough to guarantee adequate deposition within a contact. Current technology requires a thick enough TiN adhesion or "glue" layer for the blanket tungsten deposition on the contact and via levels to maintain good contact/via resistance. A minimum thickness of TiN on the contact level also serves as a barrier layer to protect junctions.

A need remains for a process which allows the use of very thin PVD TiN layers and eases concern about reduced step coverage.

DISCLOSURE OF INVENTION

In accordance with the invention, the amount of deposited PVD TiN required as an adhesion layer may be significantly reduced. The reduction in the thickness of the PVD TiN adhesion layer is achieved by first providing a layer of TiN on the bottom of the contact/via openings.

Thus, the process for applying a TiN contact/via adhesion layer to a high aspect ratio contact/via openings etched in a dielectric comprises providing a first layer of TiN on the bottom of the contact/via openings and then depositing the second layer of TiN on the first layer of TiN and on the sidewalls of the contact/via openings. The second layer of TiN serves as the contact/via adhesion (glue) layer.

In the case where a contact is etched in the dielectric down to a junction with a titanium silicide layer on top, the first layer of TiN on the bottom of the contact opening is provided by a rapid thermal anneal in a nitrogen-containing atmosphere which converts the top part of a titanium silicide layer in the contact opening into a barrier TiN layer. This nitrogen-containing atmosphere contains nitrogen-containing species (e.g. $N_2$, $NH_3$, $N_2O$) that react with titanium silicide to form TiN under the conditions provided by a rapid thermal anneal.

Alternatively, in the case where a contact is etched in the dielectric down to an underlying barrier TiN layer, the first layer of TiN on the bottom of the contact can be provided by a contact etch which is able to stop on the underlying barrier TiN layer with minimum TiN loss. The barrier TiN layer would have been formed by depositing a layer of PVD TiN prior to the formation of the dielectric layer.

In the case where a via is etched in the dielectric down to an underlying TiN anti-reflection coating on top of a metal layer, the first layer of TiN on the bottom of the via is provided by a via etch which is able to stop on the underlying TiN anti-reflection coating with minimum TiN loss. The TiN anti-reflection coating on top of the metal layer would have been formed by depositing the TiN anti-reflection coating prior to the formation of the dielectric layer.

Typically, the deposition of the TiN adhesion layer is followed by a blanket chemical vapor deposition (CVD) of tungsten and a tungsten plug is formed by chemical-mechanical polishing or etchback. In this case, the TiN adhesion layer on the sidewalls of the dielectric serves to structurally support the adhesion of the tungsten plug.

Plugs comprised of other metals may also be used in place of tungsten. Examples of other metals include copper, gold and aluminum, in particular, CVD-copper, CVD-gold and CVD-aluminum.

The invention disclosed here allows the use of very thin PVD TiN layers and eases concern about reduced step coverage. Hence, PVD TiN will continue to be employed as an adhesive layer for metal plugs, thereby extending the life of current low cost process modules.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

The present invention is directed to the process involving the application of an adhesion layer on high aspect ratio contact/via openings in a dielectric. To make electrical connection between different layers of an integrated circuit, these contact/via openings are filled with plugs of an electrically conductive material such as tungsten, which contacts previously-doped regions, polysilicon, or other metal layers. This electrically conductive material may also comprise other metals such as copper, gold, and aluminum.

Some plugs contact a polysilicon layer which is formed over a thin oxide gate layer and these plugs become gate electrodes. Other plugs contact a titanium silicide layer on doped regions in the semiconductor substrate and become source or drain contacts. Openings etched down to the gate or to the source/drain junction, which may have a titanium silicide layer on top, are termed hereinafter "contact" openings. Openings etched down to a metal layer or a TiN ARC (anti-reflection coating) on top of a metal layer are termed hereinafter "via" openings. The term "contact/via" will hereinafter be equated with "contact and/or via".

Separate embodiments of the present invention are applicable to the formation of an electrical connection at the "contact" level and at the "via" level.

Contact Level

Figure 1A:
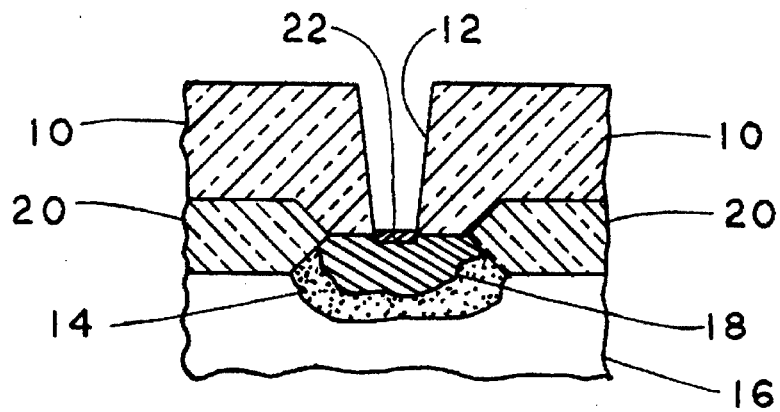
FIGS. 1a–1c are cross-sectional views depicting a contact level process flow and the resulting structure.
Figure 1B:
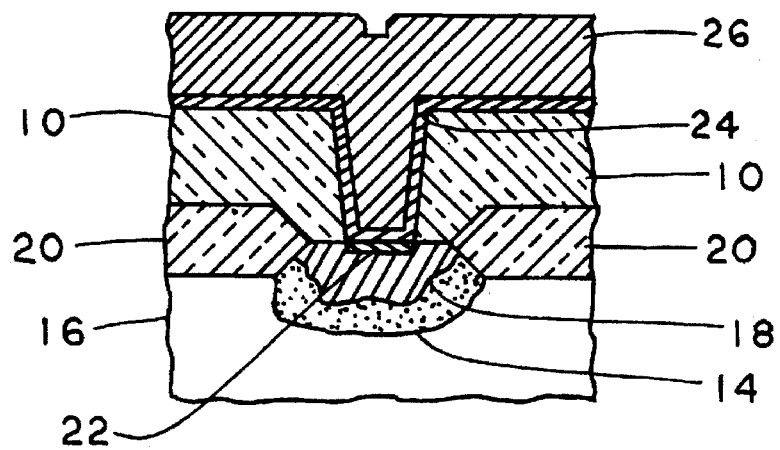
Figure 1C:
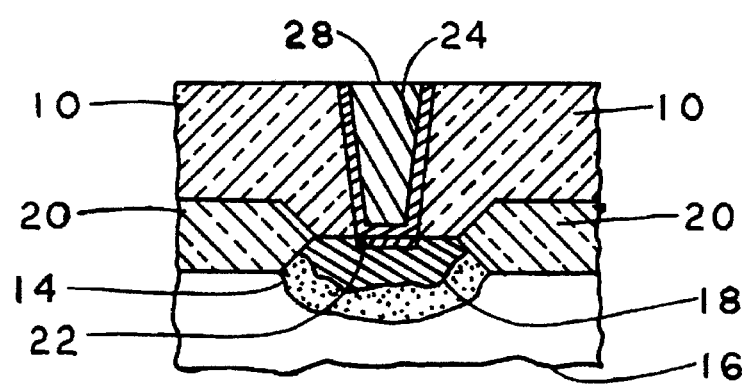

A contact level process flow is depicted in FIGS. 1a–1c. FIG. 1a shows a region of the integrated circuit where a portion of a dielectric layer 10 has been etched to form a contact opening 12 over a doped region 14 in a semiconductor substrate 16. While one such contact opening 12 is shown, it will be readily apparent to those skilled in this art that in fact a plurality of such contact openings are formed. The interlayer dielectric 10 has been etched down to a titanium silicide layer 18, formed on the doped region 14 which resides between field oxide regions 20. After the contact etch, but before the barrier metal/adhesion layer deposition, a rapid thermal anneal (RTA) of 600° C. or more in a nitrogen-containing atmosphere is used to convert the top part of the titanium silicide layer 18 in the contact opening 12 into a barrier TiN layer 22. The nitrogen-containing atmosphere contains nitrogen-containing species that react with titanium silicide to form TiN under the conditions provided by a RTA. The nitrogen-containing atmosphere may comprise $N_2$, $NH_3$, or $N_2O$, for example, although other nitrogen-containing species may be employed in the practice of the present invention. Due to the relatively high temperature cycle provided by the RTA, the overall thermal budget for the junction should be considered and optimized.

Once the barrier TiN layer 22 has been formed by RTA, the amount of deposited TiN required as an adhesion layer may be significantly reduced. The thin PVD TiN adhesion layer 24 is then deposited as the adhesion layer for the blanket tungsten deposition, described below. The thickness of this TiN adhesion layer 24 may be reduced to below a field thickness of 400 Å or less. The minimum thickness requirement for the PVD TiN adhesion layer 24 is to have at least a monolayer of TiN deposited on the contact sidewalls.

The deposition of the thin PVD TiN adhesion layer 24 is followed by the blanket deposition of a tungsten layer 26. FIG. 1b illustrates the structure of the device at this stage of processing. FIG. 1c depicts a tungsten plug 28 formed by chemical-mechanical polishing (CMP) or plasma etchback. The chemical-mechanical polishing (CMP) or plasma etchback is employed to remove the tungsten and TiN outside of the contact opening 12.

The thin layer of TiN comprising the thin PVD TiN adhesion layer 24 on the sidewall of the contact opening 12 serves to structurally support the adhesion of the tungsten plug 28. The barrier TiN layer 22 that was formed in the previous RTA step and which is now at the bottom of the contact opening 12, along with possibly a monolayer of TiN originating from the PVD TiN adhesion layer 24, provides good contact resistance and junction protection.

Figure 2A:
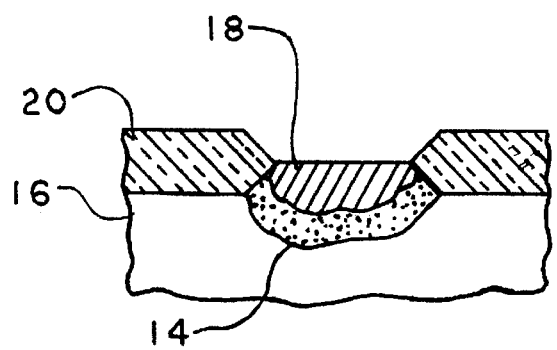
FIGS. 2a–2e are cross-sectional views depicting an alternative contact level process flow and the resulting structure.

An alternative approach to providing a solid bottom layer of TiN at the contact level is to form a barrier TiN layer 22 before the interlayer dielectric 10 has been deposited. The alternative contact level process flow is depicted in FIGS. 2a–2e. In the case where source and drain contacts are to be made, the titanium silicide layer 18 is formed on the doped region 14 in the semiconductor substrate 16 as shown in FIG. 2a. While one such doped region 14 is shown, it will be readily apparent to those skilled in this art that in fact a plurality of such doped regions exist on the semiconductor substrate 16 of an integrated circuit. The titanium silicide layer 18 is formed over a $p^+$ or $n^+$ doped region 14 in the semiconductor substrate 16 which resides between field oxide regions 20. The formation of the titanium silicide layer 18 by rapid thermal anneal is followed by the deposition of a layer of PVD TiN 29. At this level, the surface is reasonably smooth, so step coverage is not a concern. FIG. 2b illustrates the structure of the device at this stage of processing.

A resist 31 (shown in FIG. 2c) is employed to pattern the layer of PVD TiN 29. The layer of PVD TiN 29, once patterned, serves as the barrier TiN layer 22 shown in FIG. 2c. The layer of PVD TiN 29 is patterned and etched such that the barrier TiN layer 22 is localized above the titanium silicide layer 18 which covers the doped region 14. Alignment of the barrier TiN layer 22 over the titanium silicide layer 18 is easy to achieve; that is, the edges of the barrier TiN layer may extend beyond the perimeter of the titanium silicide layer.

A self-aligned silicide may be employed to form a titanium silicide layer (or salicide layer, in this case) above silicon or a self-aligned polysilicide may be employed to form a titanium polysilicide layer (or polycide layer, in this case) above polysilicon. In these cases, the barrier TiN layer 22 is localized above the salicide layer and polycide layer respectively.

Figure 2D:
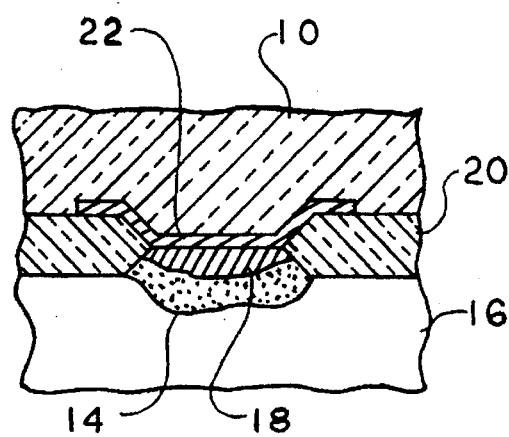
Figure 2B:
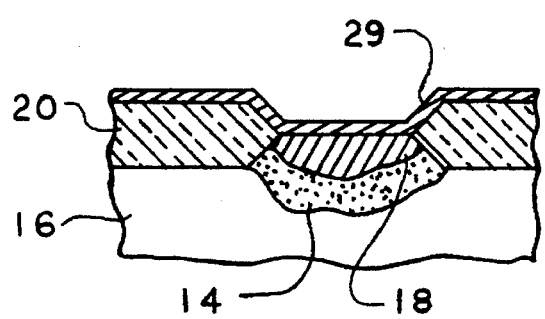
Figure 2E:
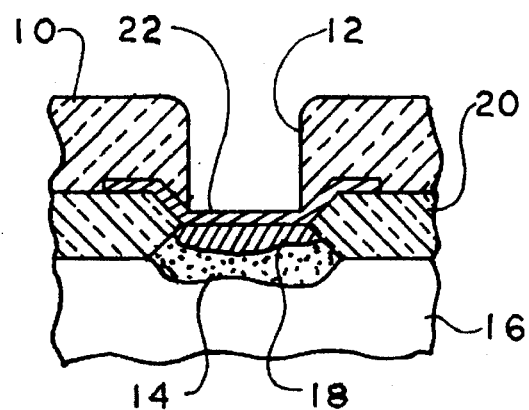
Figure 2C:
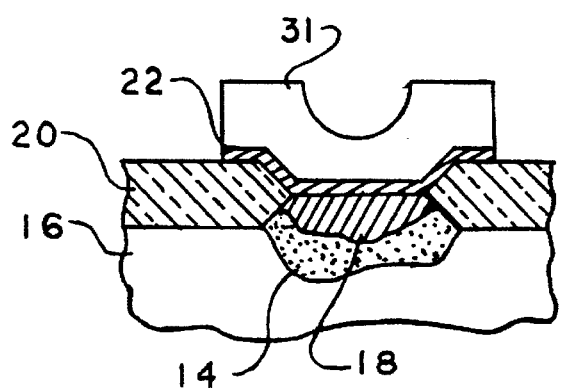

Next, after stripping off the resist 31, the interlayer dielectric 10 comprising an oxide (e.g., boron phosphorous silane-based glass (BPSG), boron phosphorous tetraethyl orthosilicate (BP-TEOS), etc.) is deposited on the surface of the field oxide 20 as shown in FIG. 2d.

Finally, the contact opening 12 is formed in the interlayer dielectric 10 by employing an etch that stops on the barrier TiN layer 22 (see FIG. 1e). The etch, which stops on the barrier TiN layer 22, is similar to the etch employed for the via level which will be discussed below. In this case, the contact etch and the via etch can be performed with the same etchant, thus simplifying the fabrication of multilayer interconnects. This feature of the present invention represents a significant advantage over conventional state of the art processes for forming multilayer interconnects.

The thin PVD TiN adhesion layer 24 can be then deposited on the barrier TiN layer 22 and on the sidewalls of the contact opening 12. As described above, the thin PVD TiN adhesion layer 24 serves as the adhesion layer for the blanket deposition of tungsten 26 required for the formation of a tungsten plug 28.

A similar process for providing the layer of TiN on the bottom of the contact opening 12 is applicable to the formation of tungsten plugs 28 that contact a polysilicon layer. In this case, the barrier TiN layer 22 is not formed on the titanium silicide layer 18. Rather, the barrier TiN layer 22 is deposited on the polysilicon layer that is formed over a thin oxide layer above the semiconductor substrate 16.

Via Level

Figure 3A:
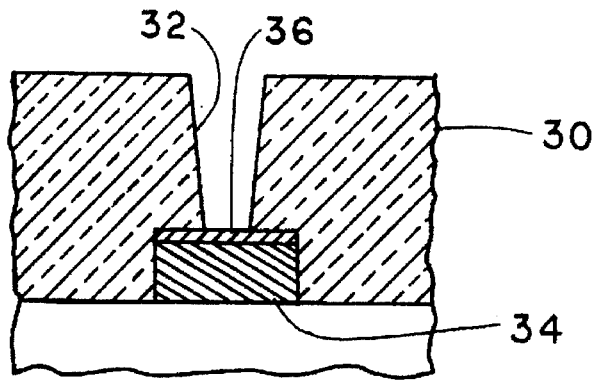
FIGS. 3a–3c are cross-sectional views depicting a via level process flow and the resulting structure.
Figure 3B:
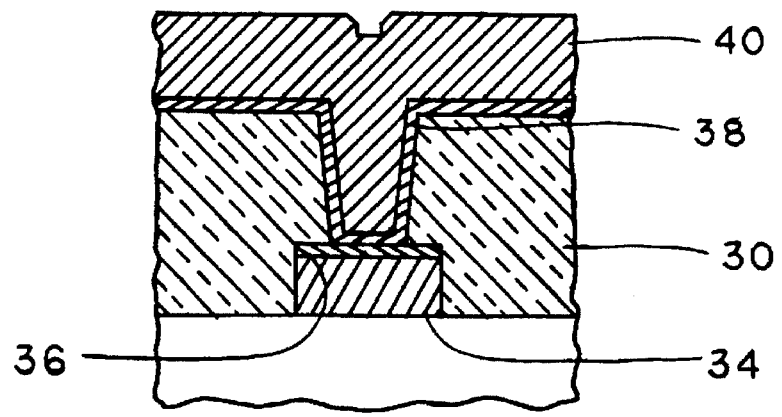
Figure 3C:
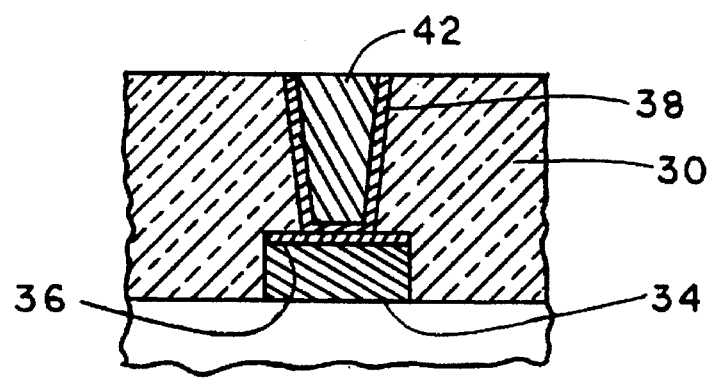

A via level process flow is depicted in FIGS. 3a–3c. FIG. 3a shows a region of the integrated circuit where a portion of a dielectric layer 30 has been etched to form a via opening 32 over an aluminum metal layer 34. While one such via opening 32 is shown, it will be readily apparent to those skilled in this an that in fact a plurality of such via openings are formed. The dielectric material in the via 32 has been etched down to a TiN anti-reflection coating (ARC) 36, formed on top of the Al metal layer 34. The TiN ARC 36 layer on top of the Al metal layer 34 is an anti-reflection layer used to aid in the patterning of the Al metal layer, as taught in U.S. Pat. No. 4,820,611, issued to William H. Arnold III, et al and assigned to the same assignee as the present application. A via etch which is able to stop on an underlying TiN ARC 36 layer with minimum TiN loss is required. Such etch-stop etchants are well-known and do not form a part of the present invention.

The etch, which stops on the TiN ARC 36 layer on top of the Al metal layer 34, is similar to the etch employed for the contact level that stopped on the barrier TiN layer 22 as discussed above. In this case, the contact etch and the via etch can be performed with the same etchant, thus simplifying the fabrication of multilayer interconnects. This feature of the present invention represents a significant advantage over conventional state of the art processes for forming multilayer interconnects.

Once the TiN ARC 36 layer has been exposed, the amount of deposited TiN required as an adhesion layer may be significantly reduced. A subsequent TiN adhesion layer 38 is next deposited, which may be 400 Å or less field thickness (as for the contact level, described above). The thin PVD TiN adhesion layer 38 comprises the adhesion layer for the blanket deposition of a tungsten layer 40. The minimum thickness requirement for the PVD TiN adhesion layer 38 is to have at least a monolayer of TiN deposited on the via sidewalls.

The deposition of the thin PVD TiN adhesion layer 38 is followed by the blanket deposition of the tungsten layer 40. FIG. 3b illustrates the structure of the device at this stage of processing. FIG. 3c depicts a tungsten plug 42 formed by chemical-mechanical polishing (CMP) or plasma etchback. The chemical-mechanical polishing (CMP) or plasma etchback is employed to remove the tungsten and TiN outside of the via opening 32.

Advantages of the Invention

The benefits of the process of the present invention are:

1. The process extends the lifetime of the current low cost PVD technology.

2. The process improves PVD and tungsten plug formation throughput, as thinner TiN deposition is needed.

3. The process improves tungsten plug formation, i.e., there is less of a seam in the middle of the plug. A thicker TiN adhesion layer creates more overhang of the TiN adhesion layer at the top of the step edge of the contact/via sidewalls. More overhang of the TiN adhesion layer increases the likelihood of a void or a bigger seam in the tungsten plug.

INDUSTRIAL APPLICABILITY

The process of the invention for applying a TiN contact/via adhesion layer to a high aspect ratio contact/via openings is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A multilayer interconnect structure formed in a dielectric comprising:

(a) at least one high aspect ratio contact/via opening etched in said dielectric, each said contact/via opening having a bottom and sidewalls;

(b) a first layer of TiN on said bottom of said contact/via openings having a thickness;

(c) a second layer of TiN having a thickness deposited on said first layer of TiN and on said sidewalls of said contact/via openings, said second layer of TiN substantially covering said sidewalls and serving as an adhesion layer, said thickness of said second layer of TiN being smaller than said thickness of said first layer of TiN; and (d) a metal plug in each said contact/via opening and adhered to said bottom and sidewalls thereof by said second layer of TiN.

2. The multilayer interconnect structure of claim 1 wherein said second layer of TiN comprises at least a monolayer of TiN.

3. The multilayer interconnect structure of claim 2 wherein said second layer of TiN has a maximum thickness of about 400 Å.

4. The multilayer interconnect structure of claim 1 wherein said metal plug consists essentially of a metal selected from the group consisting of tungsten, copper, gold, and aluminum.

5. The multilayer interconnect structure of claim 1 wherein each said contact/via opening is formed over a doped region in said semiconductor substrate, over a polysilicon layer, over a polycide layer, over a salicide layer, or over an aluminum metal layer.

* * * * *